United States Patent
Rozental et al.

(10) Patent No.: US 9,602,115 B1
(45) Date of Patent: Mar. 21, 2017

(54) METHOD AND APPARATUS FOR MULTI-RATE CLOCK GENERATION

(71) Applicant: MOTOROLA SOLUTIONS, INC., Schaumburg, IL (US)

(72) Inventors: Mark Rozental, Gedera (IL); Ricardo Franco, Plantation, FL (US); Claudine Tordjman, Holon (IL); Richard S. Young, Weston, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/174,871

(22) Filed: Jun. 6, 2016

(51) Int. Cl.
| | |
|---|---|
| H03L 7/06 | (2006.01) |
| H03L 7/099 | (2006.01) |
| H03L 7/093 | (2006.01) |
| H03L 7/095 | (2006.01) |
| H03L 7/089 | (2006.01) |
| H03K 5/15 | (2006.01) |
| H03L 7/18 | (2006.01) |

(52) U.S. Cl.
CPC ....... *H03L 7/0996* (2013.01); *H03K 5/15046* (2013.01); *H03L 7/0891* (2013.01); *H03L 7/093* (2013.01); *H03L 7/095* (2013.01); *H03L 7/1806* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 5,325,401 A | * | 6/1994 | Halik | H04L 25/05 329/307 |
| 5,528,633 A | * | 6/1996 | Halik | H04L 25/05 329/307 |
| 6,177,844 B1 | * | 1/2001 | Sung | G06F 1/10 327/156 |
| 6,794,913 B1 | * | 9/2004 | Stengel | H03L 7/0814 327/158 |
| 7,114,069 B2 | | 9/2006 | Tomerlin et al. | |
| 7,162,000 B2 | | 1/2007 | Stengel et al. | |
| 8,274,339 B2 | | 9/2012 | Fan et al. | |
| 8,432,229 B2 | | 4/2013 | Dong et al. | |

(Continued)

OTHER PUBLICATIONS

Park et al., "Fixed and Variable Length ring Oscillators for Variability Characterization in 45nm CMOS," IEEE (2009) Custom Intergrated Circuits Conference (CICC) pp. 519-522.

(Continued)

*Primary Examiner* — Adam Houston
(74) *Attorney, Agent, or Firm* — Michael Best & Friedrich LLP

(57) ABSTRACT

A method and device for generating a multi-rate clock signal using a ring voltage-controlled oscillator based phase-locked loop is provided. The device includes a delay line having a length extending beyond a predetermined length required for operation of the phase-locked loop. The device further includes a tap tuning logic circuit coupled to the delay line. The delay line receives an input signal and a tuning voltage from the phase frequency detector, charge pump and loop filter circuits and generates a plurality of tapped output signals. The plurality of tapped output signals is received by the integrated digital multi-rate clock generator configured to create a plurality of clock signals.

11 Claims, 6 Drawing Sheets

(56) References Cited

U.S. PATENT DOCUMENTS

| | | | | |
|---|---|---|---|---|
| 8,718,217 B2* | 5/2014 | Walker | ................... | H03L 7/087 |
| | | | | 327/148 |
| 8,841,948 B1 | 9/2014 | Chien et al. | | |
| 2009/0167379 A1* | 7/2009 | Mobin | .................. | H03L 7/0812 |
| | | | | 327/149 |
| 2009/0295441 A1* | 12/2009 | Kwak | .................. | H03L 7/0805 |
| | | | | 327/158 |
| 2009/0295442 A1* | 12/2009 | Kwak | ....................... | G06F 1/06 |
| | | | | 327/158 |
| 2010/0090733 A1* | 4/2010 | Kristensson | ............ | H03L 7/085 |
| | | | | 327/156 |
| 2013/0271193 A1* | 10/2013 | Keith | .................... | H03L 7/0812 |
| | | | | 327/158 |
| 2014/0118040 A1* | 5/2014 | Nakayama | ............ | H03L 7/0816 |
| | | | | 327/157 |
| 2014/0333346 A1* | 11/2014 | Bae | ........................ | H03L 7/087 |
| | | | | 327/5 |
| 2015/0213873 A1* | 7/2015 | Joo | ........................ | H03L 7/087 |
| | | | | 365/154 |
| 2016/0182063 A1* | 6/2016 | Seo | ....................... | H03L 7/0812 |
| | | | | 327/149 |

OTHER PUBLICATIONS

MRCG IPEXTREME, "Motorola Multiple Reference Clock Generator," brochure (2007) pp. 1-2, www.ip-extreme.com.

Mandal et al., "Design of Variable Length Ring Oscillator for Clock Synthesis," (Oct. 18, 2013) pp. 313-317, India.

* cited by examiner

US 9,602,115 B1

METHOD AND APPARATUS FOR MULTI-RATE CLOCK GENERATION

BACKGROUND

Phase-locked loops (PLLs) are used in many communication systems. A phase-locked loop or phase lock loop (PLL) is a control system that generates an output signal whose phase is related to the phase of an input signal. A phase-locked loop may be used to maintain timing integrity and clock synchronization. Ring oscillator-type, voltage-controlled oscillators (VCOs) have been used in phase-locked loop systems for high-speed clock generation. An advantage of a ring oscillator-type voltage-controlled oscillator is that it may be integrated in complementary metal oxide semiconductor (CMOS) technology without introducing additional process and modeling complexity. On the other hand, disadvantages of a ring oscillator-type, voltage-controlled oscillator include jitter due to higher thermal noise and power supply noise. Also, as complementary metal oxide semiconductor process technology scales down in size, circuit complexity and operating speed increase. Additionally, ring oscillator type voltage-controlled oscillators have a narrow frequency range and may not be able to cover the frequency target in high-volume production applications due to process, voltage and/or temperature variations. A low power and low jitter phase-locked loop to generate a plurality of high speed clocks is desired.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1A:
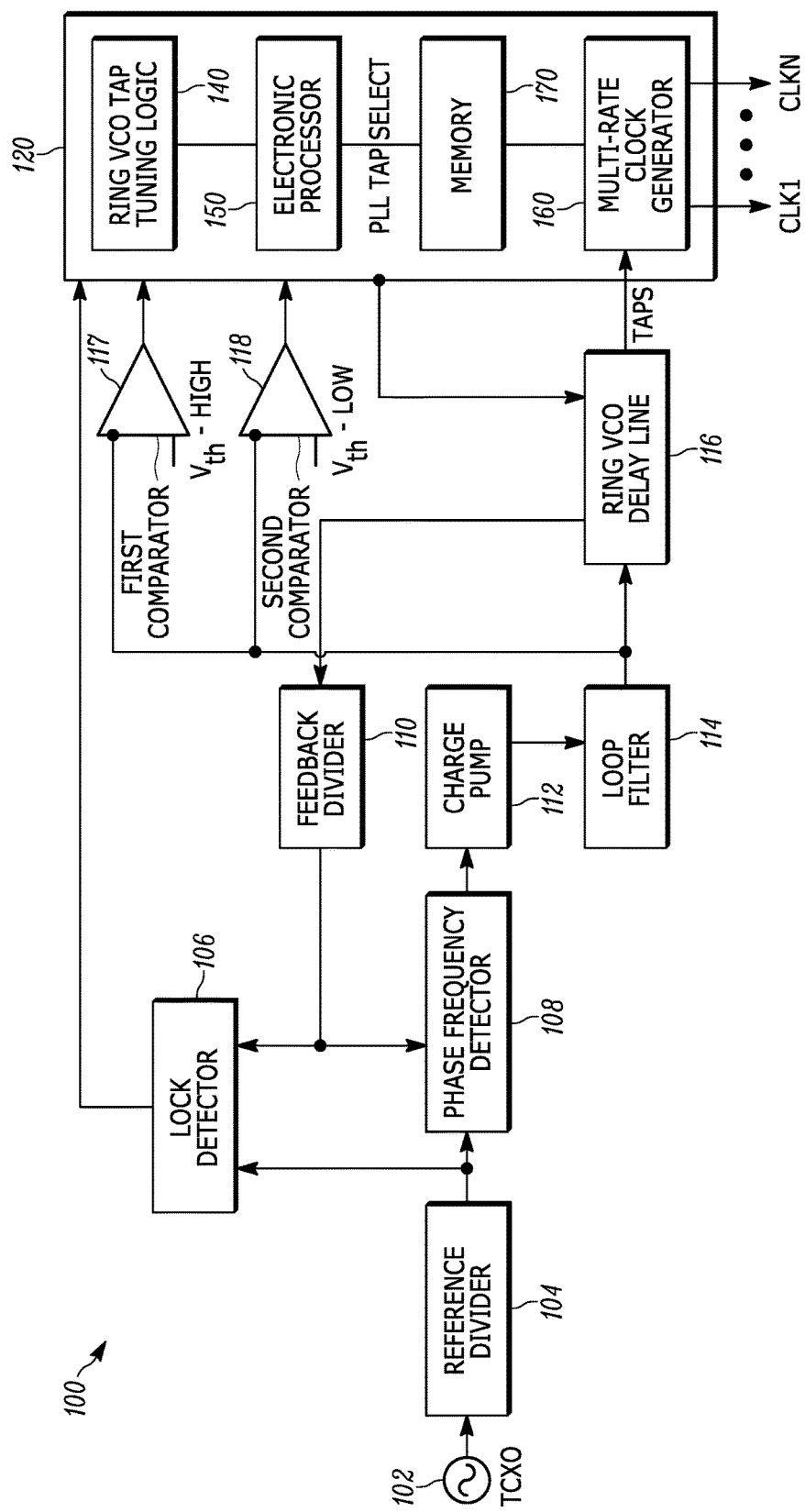
FIG. 1A is a diagram of a ring voltage-controlled oscillator based phase-locked loop in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

One exemplary embodiment provides a ring voltage-controlled oscillator based phase-locked loop with an integrated multi-rate clock generator. The ring voltage-controlled oscillator based phase-locked loop includes a delay line having a length extending beyond a predetermined length required for operation of the phase-locked loop; a tap tuning logic circuit coupled to the delay line; and an integrated digital multi-rate clock generator coupled to the delay line. The delay line is configured to receive a tuning voltage from the loop filter circuit and generate a plurality of tapped output signals. The digital multi-rate clock generator receives the plurality of tapped output signals and creates a plurality of clock signals.

Another exemplary embodiment provides a method of generating a multi-rate clock signal. The method includes providing a delay line for a phase-locked loop and that has a length extending beyond a predetermined length required for operation of the phase-locked loop. The method also includes receiving a tuning voltage at the delay line; generating a plurality of tapped output signals using the delay line; receiving at a digital multi-rate clock generator the plurality of tapped output signals from the delay line; and combining at the digital multi-rate clock generator the plurality of tapped output signals to create one or more clock signals.

FIG. 1A is a block diagram of a ring voltage-controlled oscillator based phase-lock loop 100 in accordance with some embodiments. The ring voltage-controlled oscillator based phase-locked loop 100 includes a temperature compensated crystal oscillator (TCXO) 102, a reference divider 104, a lock detector 106, a phase frequency detector 108, a feedback divider 110, a charge pump 112, a loop filter 114, a ring voltage-controlled oscillator and delay line extension circuit 116, a first comparator 117, a second comparator 118, and a digital logic circuitry block 120. The digital logic circuitry block 120 includes a ring voltage-controlled oscillator tap tuning logic circuit 140, an electronic processor 150, and multi-rate clock generator 160, and a memory 170. Other exemplary embodiments may include more or fewer of each of the illustrated components, may combine some components, or may include additional or alternative components.

In FIG. 1A, the temperature compensated crystal oscillator 102 provides a reference clock signal for the ring voltage-controlled oscillator phase-locked loop 100. In some embodiments, the temperature compensated crystal oscillator 102 generates a reference clock that has a frequency range of approximately fifteen (15) Megahertz (MHz) to forty (40) MHz. Some examples of reference clock frequencies that the temperature compensated crystal oscillator 102 generates are around 16.8 MHz, 19.2 MHz and 38.4 MHz. As shown in FIG. 1A, output of the temperature compensated crystal oscillator 102 is provided to the reference divider 104. The output of the reference divider 104 is received at the lock detector 106 and the phase frequency detector 108. The charge pump 112 acts as a current source and "pumps" current into and out of the loop filter 114. An output signal from the loop filter 114 is provided to the ring voltage-controlled oscillator delay line extension circuit 116, the first comparator 117, and the second comparator 118. At the first comparator 117, the voltage of the output signal from the loop filter 114 is compared to a high threshold voltage (Vth_High). At the second comparator 118, the voltage of the output signal from the loop filter 114 is compared to a low threshold voltage (Vth_Low). In some embodiments, the output of the first comparator 117 and the second comparator 118 is provided to the ring voltage-controlled oscillator tap tuning logic circuit 140, which, in turn, generates a phase-locked loop tap select control signal that is provided to the ring voltage-controlled oscillator delay line extension circuit 116.

In some embodiments, the loop filter 114 is a device separate from the ring voltage-controlled oscillator phase-locked loop 100, which device provides an output voltage (Vtune) to the ring voltage-controlled oscillator and delay line extension circuit 116. The delay of the ring voltage-controlled oscillator delay line extension circuit 116 changes with the change in Vtune applied to delay cells within the ring voltage-controlled oscillator delay line extension circuit 116. As a result, the frequency of clock signals received from the ring voltage-controlled oscillator based phase-locked loop 100 will vary as a function of Vtune. The ring voltage-controlled oscillator delay line extension circuit 116 generates a number of tapped delay outputs that are provided to the multi-rate clock generator 160. The multi-rate clock generator 160 receives the tapped delay outputs and combines them to create output clocks having a desired clock frequency. In some embodiments, the ring voltage-controlled oscillator delay line extension circuit 116 is designed in such a manner to have sufficient length that the total delay spans one cycle of the phase-locked loop frequency. Just as delay variation requires tuning of the oscillator delay period, the delay line length that spans one phase-locked loop cycle will vary with operating conditions. One maintenance consideration of the design provided herein is that the delay line length for one cycle is preferably measured and supplied to the clock generation processing. The delay line is measured by comparing delay cell outputs and determining which delay cells rising edge aligns with the rising edge as it is input to the delay line.

The multi-rate clock generator 160 may be implemented in many ways. In an embodiment, the rising and falling edges are counted serially with counters consisting of accumulators to trace the fractional phase of the output clock and a counter to track delay which is greater than one phase-locked loop clock period. The counters are clocked at the phase-locked loop rate. The phase increment is applied to the accumulator and represents the time that the next edge will occur. The phase increment of an integer and fractional component is represented herein as a thirty two (32) bit value with eight (8) bits representing the integer value and twenty four (24) bits representing the fractional value. On each clock, the integer value is decremented until it reaches zero. On the next cycle, the fractional portion of the counter is quantized to a fixed delay line length to determine the fraction of the cycle, or which delay cell, will be taken as the output for the clock edge. The calculated output delay cell is scaled to match the measured delay line length. The phase increment is added to the accumulator to calculate the next output edge. As a result, a phase increment count of one (1) creates an edge of each phase-locked loop clock cycle, which corresponds to an output clock of one half the phase-locked loop frequency. An output clock equal to the phase-locked loop rate would require a phase increment value of 0.5. This value could be further reduced to create an output clock that is higher in frequency than the phase-locked loop frequency. The number of operations in the accumulator processing depends on the phase increment applied to the counters. For a value of 1.0 or larger there is no more than one calculation per phase-locked loop clock cycle. For a value of 0.5 up to 1.0 there will be one or two calculations. For a value of 0.333 up to 0.5 there will be two or three calculations per cycle. For a value of 0.25 up to 0.333 there will be three or four calculations. These calculations may be performed in a parallel manner to guarantee completion within the required time period. The accumulator processing is used to create a delay cell mask for each phase-locked loop clock cycle. This mask is used to determine which delay cells are output to create the clock. The result of each selected output delay cell is a pulse for each edge of the output clock. These pulses are combined and are input into a toggle flip-flop to create the desired output clock edge.

In an exemplary embodiment, a fifty percent (50%) duty cycle clock may be generated to drive digital clocks. In other embodiments, other duty cycle clocks may be generated by creating a schedule for the phase increment applied to the counters. The phase increment could also be offset by a modulation value to create a modulated output if so desired. In some embodiments, more than one multi-rate clock generator 160 is used in conjunction with a single ring voltage-controlled oscillator delay line extension circuit 116. In such embodiments, each multi-rate clock generator 160 is able to generate an output clock from the delayed output cells of the ring voltage-controlled oscillator delay line extension circuit 116.

In some embodiments, the multi-rate clock generator 160 may generate clocks having frequencies up to twice the phase-locked loop frequency, but is only limited by the speed of the circuitry and the resolution of one delay cell in the ring voltage-controlled oscillator delay line extension circuit 116. In some embodiments, the multi-rate clock generator 160 may generate clocks having frequencies down to approximately $1/512^{th}$ of the phase-locked loop frequency or lower, depending on the application requirements.

Figure 1B:
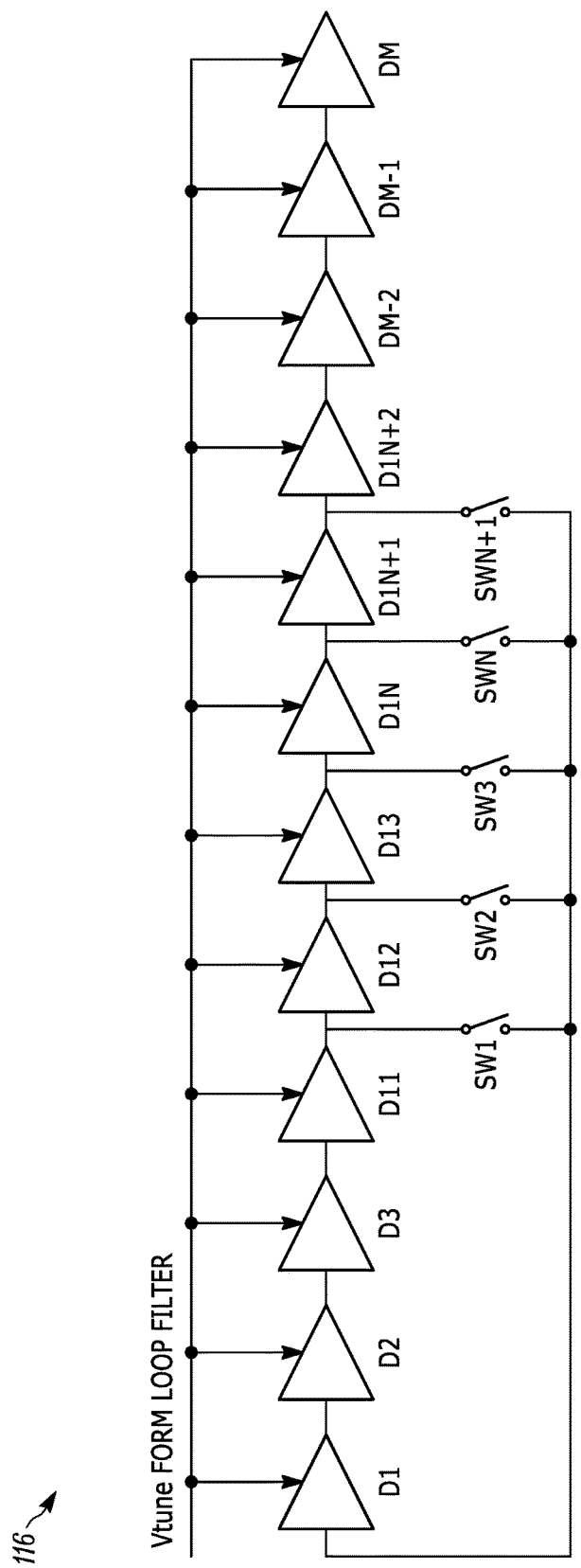
FIG. 1B is a diagram of the delay line for the ring voltage-controlled oscillator based phase-locked loop shown in FIG. 1A in accordance with some embodiments.

FIG. 1B illustrates an exemplary embodiment of the ring voltage-controlled oscillator delay line extension circuit 116 shown in FIG. 1A. The ring voltage-controlled oscillator delay line extension circuit 116 includes current starved inverters D1 through DM configured to receive a voltage (Vtune) from the loop filter 114. The length of the ring voltage-controlled oscillator is controlled by switches SW1 through SWN+1 with only one switch being closed at any given time. Delay buffers that are part of the ring voltage-controlled oscillator together with the inverter that is placed after the closed switch form a delay line with a delay equal to approximately $1/(2*f_{VCO})$, where $f_{VCO}$ is the frequency of the voltage-controlled oscillator.

Figure 2:
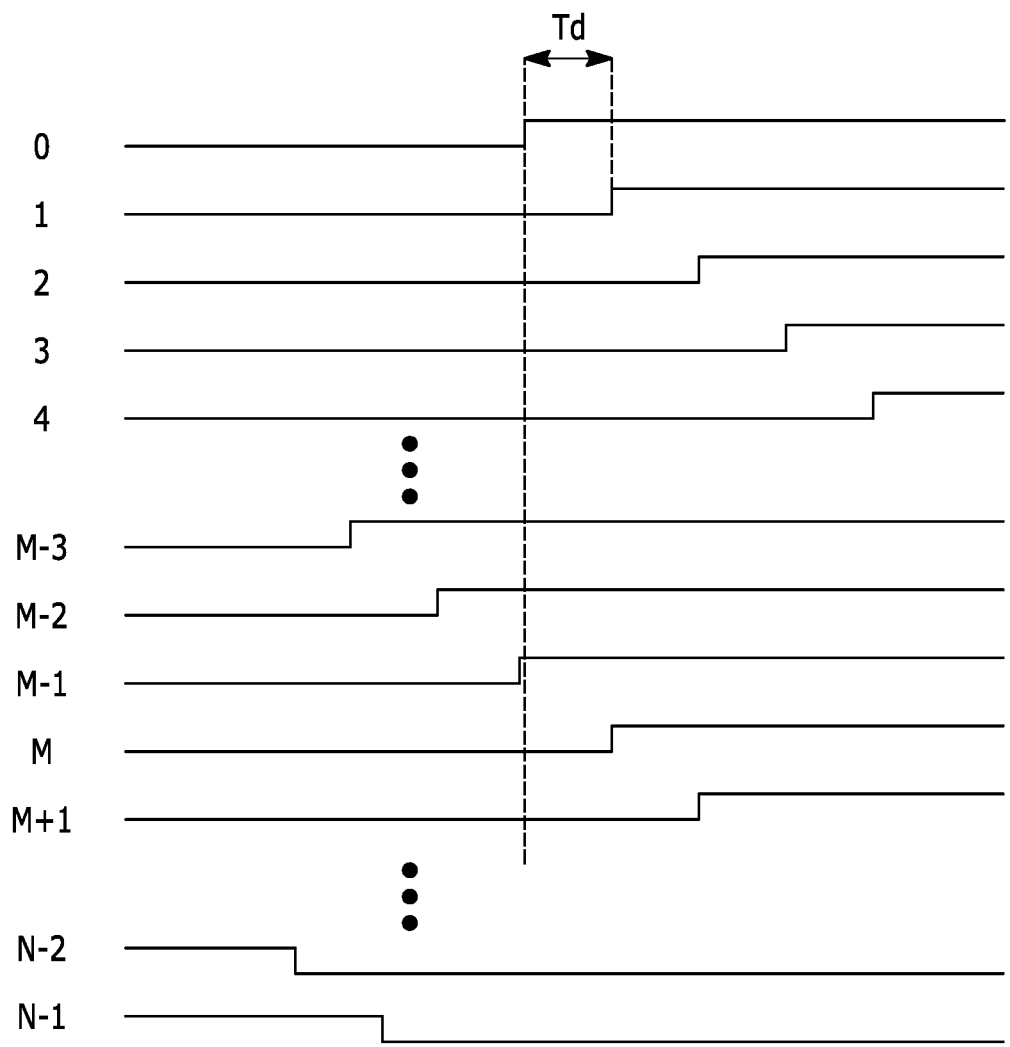
FIG. 2 illustrates a delay line waveform in accordance with some embodiments.

FIG. 2 illustrates the delay line waveforms in accordance with some embodiments. In FIG. 2, time progresses from left to right and each delay cell in FIG. 1B contributed approximately Td time delay to the input signal.

Figure 3:
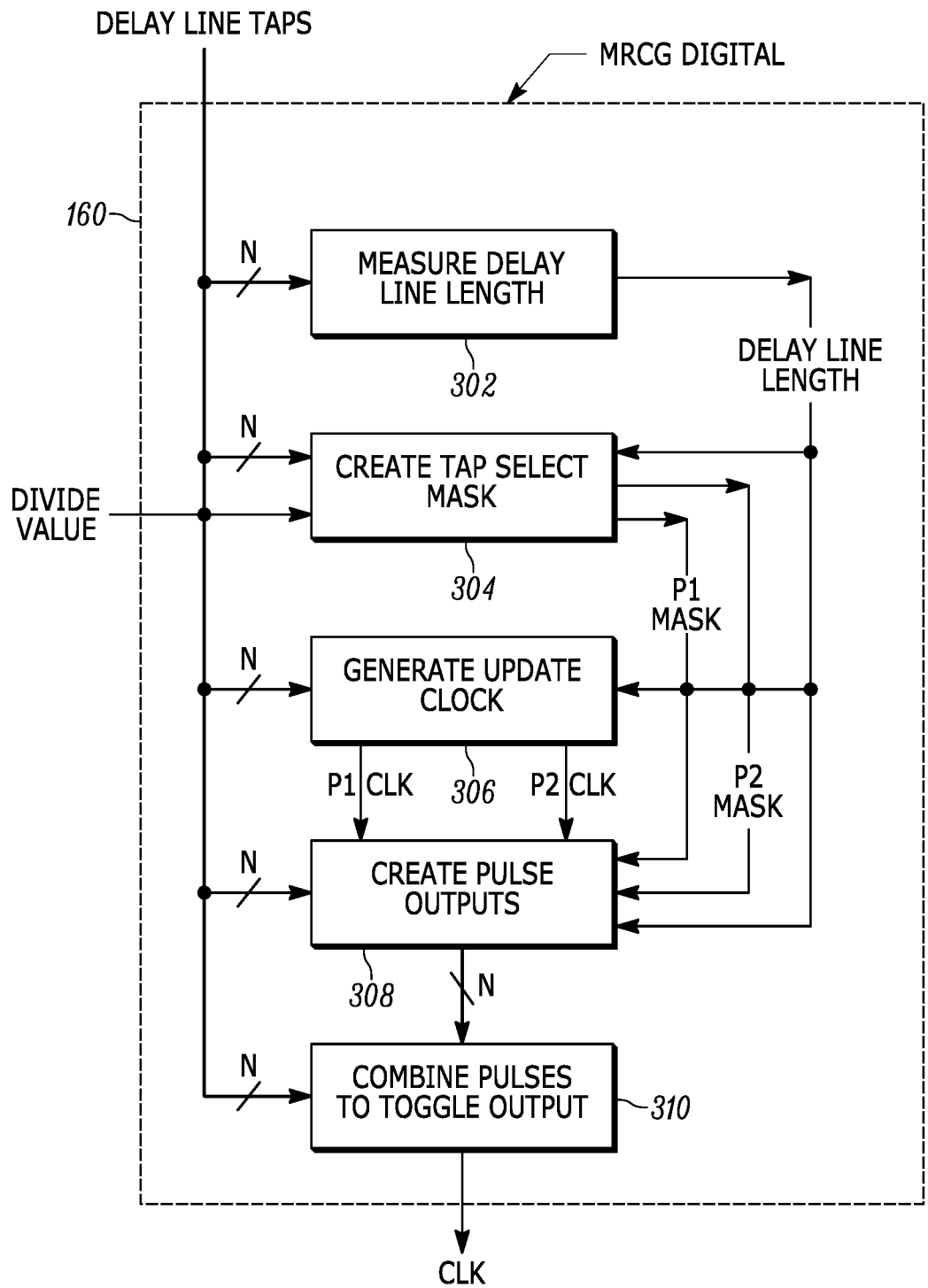
FIG. 3 is a block diagram of a multi-rate clock generator (MRCG) in accordance with some embodiments.

FIG. 3 is a block diagram of an exemplary embodiment of the multi-rate clock generator 160. In some embodiments, the multi-rate clock generator 160 includes the following functional blocks, a delay line length measuring circuit 302, a tap select mask creation circuit 304, a circuit to generate an update clock 306, a pulse output generator circuit 308 and a combining circuit 310. These functional blocks may be implemented either in hardware or software. Other exemplary embodiments may include more or fewer of each of the illustrated components, may combine some components, or may include additional or alternative components. In some embodiments, functional blocks are provided by software programs residing in the memory 170 that may be executed by the electronic processor 150.

In some embodiments, the delay line length measuring circuit 302 is configured to measure the delay line length by tracking the first tap outputting a rising edge transition to logic "1" increasing through the delay cells to where the output matches that of tap 0 with the following delay cell output at logic "0" as shown in FIG. 2. In the example shown in FIG. 2, tap M−1 is the first tap following tap 0 that matches the state of tap 0 based on the rising edge timing of tap 0 with tap M−2 matching tap 0 and tap M in the opposite state indicating tap M−1 is the leading edge of the previous cycle. As a result, the delay line cycle length in this example is M taps in a delay line of N total taps.

In some embodiments, the tap select mask creation circuit 304 is configured to use the programmed divide value to create a tap select mask that may be used to select the tap that will define the position of a rising or falling edge of the output signal. The divide value is a mixed number with an integer and a fractional part. The divider value is added to the accumulator to determine when the next output edge would occur. For example, if the divide value is 4.5, since two edges are needed to be generated for one cycle the divider is set up for 2.25 to the first edge and another 2.25 to the second edge. So the accumulator increment value is set to 2.25 and the accumulator content begins at 0.0. By adding in the increment value the new value for the accumulator is 2.25. Each cycle through the delay line (tap 0) we decrement the accumulator by 1.0 (1.25 at first cycle) and again (0.25 at the second cycle). Since the accumulator is <1.0 on the second cycle it will output an edge in this cycle and update by adding in the increment value again.

The output edge location is determined by the fractional content of the accumulator. In this case it is 0.25, which is the fraction of the distance through the delay line cycle length needed to create the output edge. From the previous example of delay line cycle length the length was M taps. Therefore, the tap chosen for this edge would be equal to round (0.25*M)−1 set. Following this the accumulator is incremented by the increment value to set up for the next output edge. Since the accumulator content is now 0.25, 2.25 is added to get 2.5 as the new accumulator value. This value is decremented by 1.0 on each cycle three and four through the delay line until cycle five where the content is 0.5. Since the value is less than 1.0 this value is handled in the same manner as was done during the previous quantization in cycle 2. The phase of the output signal is maintained by using the accumulator to maintain the division. For cycles where there are no outputs the tap select mask bits are all set to zero so that subsequent circuits do not create an output. For any divide value >2.0, there will be one or fewer edges generated during each cycle of the delay line. A divide value of exactly 2.0 will have an increment of 1.0 and therefore exactly one tap select mask bit set for each delay line cycle. For divide values <2.0, there will be one or more tap select mask bits set during each delay line cycle. With an increment of <1.0 there will be cycles with two or more tap select mask bits set.

As an example, if the accumulator state were 0.35 and the increment is 0.4 (divide value=0.8), the corresponding tap select mask bit of round (0.35*M)−1 is set and the increment is added to the accumulator to give a value of 0.75. The tap select mask bit corresponding to round (0.75*M)−1 is then set. Since the accumulator is still <1.0 the increment value is added again to result in an accumulator value of 1.15. In this case there are two output edges during the cycle. On the next cycle the accumulator is decremented by 1 to a value of 0.15 and the corresponding tap select mask bit of round (0.15*M)−1 is set. The increment value is added again to give an accumulator value of 0.55 and the corresponding tap select mask bit of round (0.55*M)−1 is set. Since the accumulator is at 0.55 the increment value is added again to yield an accumulator value of 0.95 and the corresponding the tap select mask bit of round (0.95*M)−1. The accumulator is still <1.0 and therefore the increment is added again producing an accumulator value of 1.35. As a result, there are three output edges during this cycle.

In some embodiments, the pdate clock generating circuit 306 is configured to create the phased clocks and to apply the tap select mask to the output network. Since the system operates synchronously and the various steps require finite time intervals to apply and create the outputs, the tap select mask is applied in two phases to create timing margin. This is accomplished by determining the cycle length of the delay line and applying the tap masked in a phased manner so that it is updating the first half day line tap mask bits while the signal edge is propagating through the second half of the delay line. Conversely the second half tap select mask is applied while the signal edge is propagating through the first half. In this design, the rising edge is used to generate signals so the falling edge timing is not as important. The clock updating circuit 306 sources the phase clocks from the delay line based upon the measured cycle length of the delay line and outputs them to subsequent circuits.

In some embodiments, the pulse output generating circuit 308 is configured to use the tap select mask as an indication of which taps of the delay line will be used to output a pulse. One method of doing this is to have each delay cell's output logically combined with and exclusive OR (XOR) gate with a delay cell spaced further down the delay line to create a pulse when the signals are different. The delay cell chosen will determine the pulse width. The tap select mask is logically combined with an AND gate with each of these outputs. If the tap position is enabled in the tap select mask the corresponding pulse is propagated to the next processing stage If the corresponding tap mask select bit is clear then the pulse does not propagate In some embodiments, the combining circuit 310 will logically OR the output pulses to create a single signal with all pulses spaced as selected in time. This signal is then used to drive the clock input to a T (toggle) flip flop to create the programmed output clock.

Figure 4:
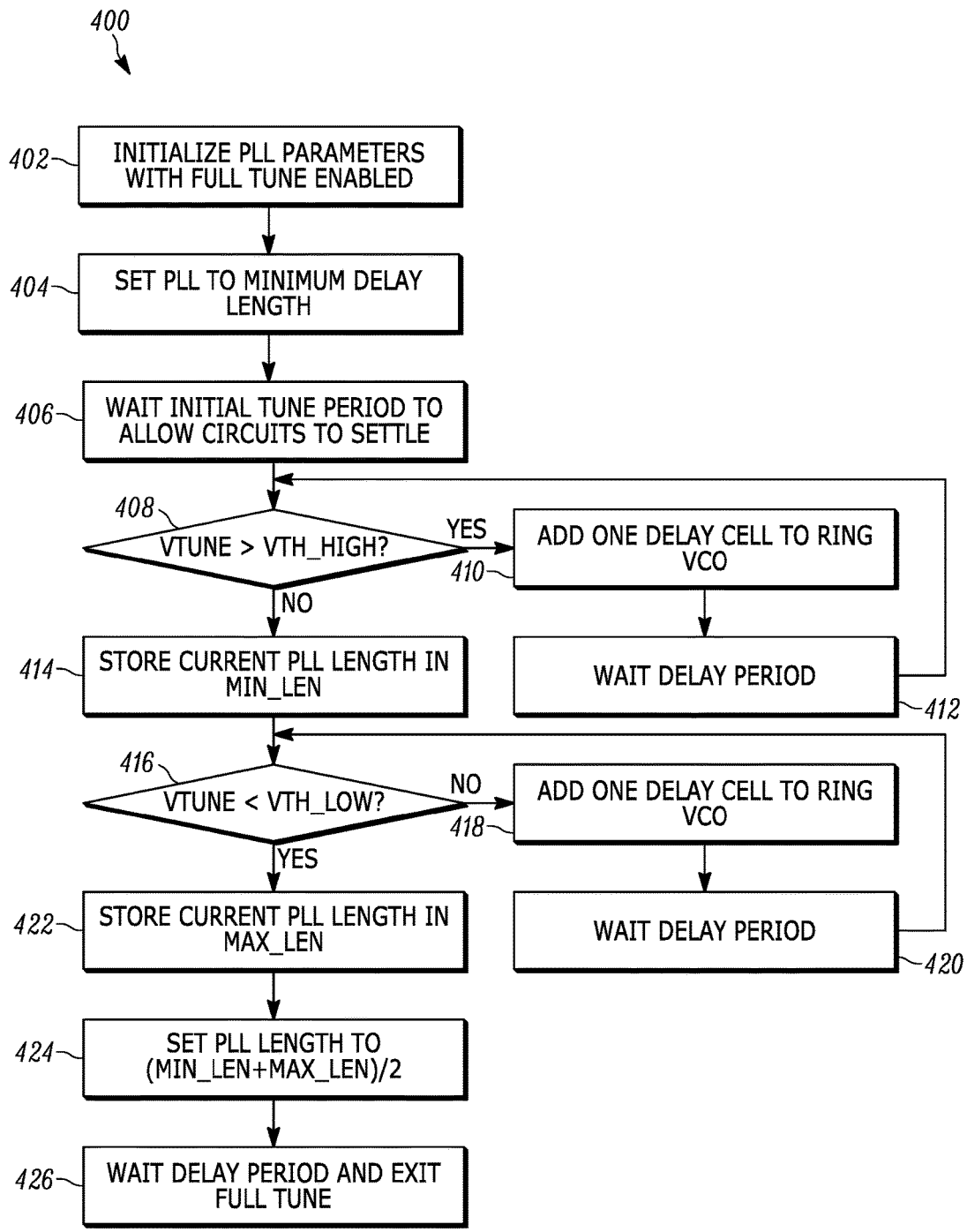
FIG. 4 is a flow chart of a method of performing an initial tuning of the ring voltage-controlled oscillator based phase-locked loop in accordance with some embodiments.

FIG. 4 is a flow chart 400 of an exemplary method 400 of performing an initial tuning of the ring voltage-controlled oscillator based phase-locked loop. At block 402, the ring voltage-controlled oscillator based phase-lock loop 100 initializes phase-locked loop parameters and enables full tuning before proceeding to block 404. At block 404, ring voltage-controlled oscillator based phase-lock loop 100 sets the phase-locked loop to have a minimum delay length. At block 406, the ring voltage-controlled oscillator based phase-lock loop 100 allows the circuits to settle by waiting an initial tune period. At block 408, the ring voltage-controlled oscillator based phase-lock loop 100 checks to confirm whether Vtune >Vth_high. If Vtune >Vth_high, then the method 400 progresses to block 410 where one delay cell is added to the ring voltage-controlled oscillator phase-locked loop. The method 400 progresses from block 410 to block 412 where the ring voltage-controlled oscillator based phase-lock loop 100 waits for a particular delay period. If Vtune is not greater than Vth_high, then method 400 moves to block 414 where the current phase-locked loop delay length is stored in the memory 170 as a minimum length (for example, as a variable MIN_LEN). Method 400 progresses from block 414 to block 416 where the ring voltage-controlled oscillator based phase-lock loop 100 checks to confirm whether Vtune <Vth_low. If Vtune is not less than Vth_low, then method 400 progresses to block 418 wherein one delay cell is added to ring voltage-controlled oscillator phase-locked loop. Following block 418, the method progresses to block 420 wherein the ring voltage-controlled oscillator based phase-lock loop 100 waits for a particular delay period. If Vtune is less than Vth_low in block 416 then method 400 progresses to block 422 wherein the current phase-locked loop delay length is stored in the memory 170 as MAX_LEN. Method 400 further progresses to block 424 wherein the phase-locked loop delay length is set to (MIN_LEN+MAX_LEN)/2. The method 400 further continues to block 426 where the ring voltage-controlled oscillator based phase-lock loop 100 waits for a particular delay period and continues to exit full tuning.

Figure 5:
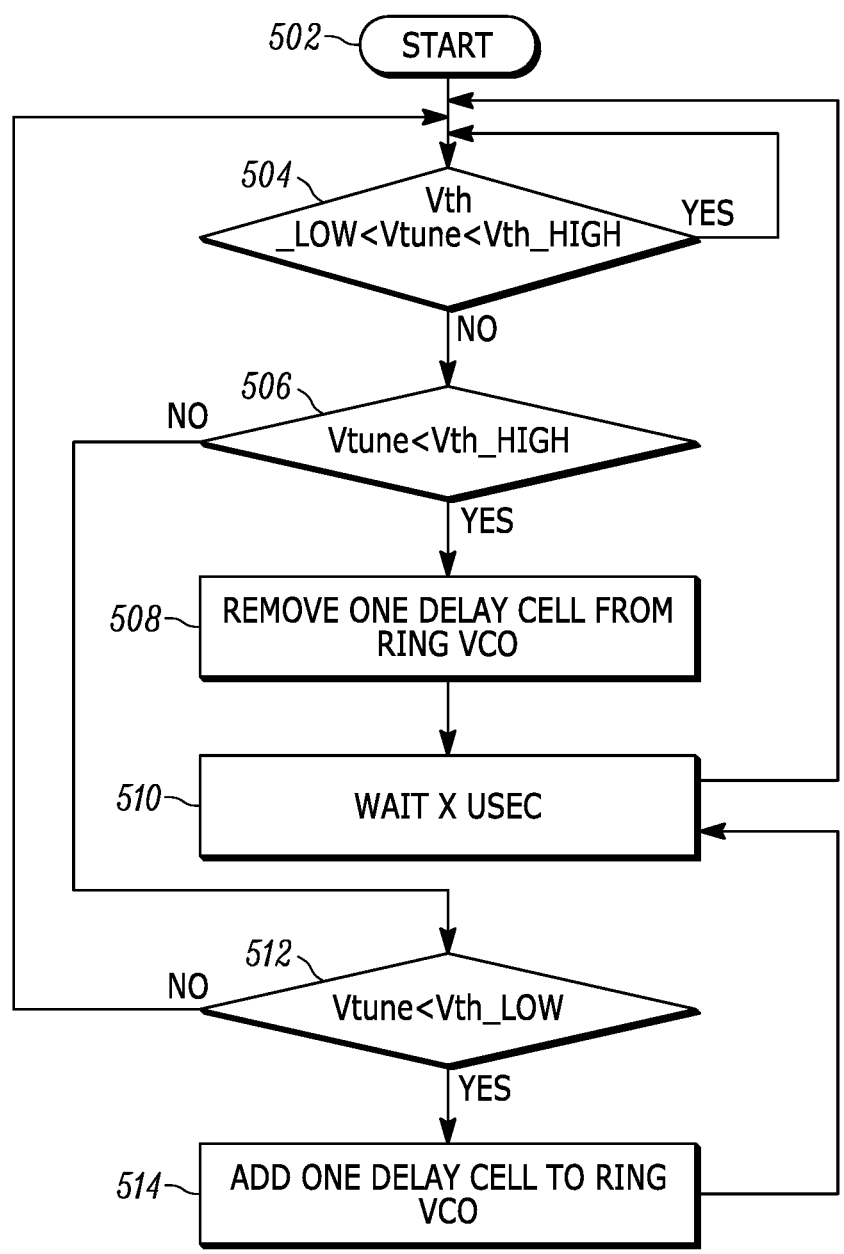
FIG. 5 is a flow chart of a method of adaptively adding and removing delay cells during operation of the ring voltage-controlled oscillator based phase-locked loop in accordance with some embodiments.

FIG. 5 is a flow chart of an exemplary method 500 of adaptively adding and removing delay cells during operation of the ring voltage-controlled oscillator phase-locked loop 100. Method 500 starts at block 502 and proceeds to block 504 wherein Vtune is compared with Vth_low to check whether it is greater than Vth_low and compared with Vth_high to check whether it is lower than Vth_high. If either of the above two conditions are not true, method 500 proceeds to block 506. On the other hand, if the Vtune is greater than Vth_low and lower than Vth_high, then method 500 has completed.

At block 506, method 500 checks whether Vtune is greater than Vth_high. If Vtune is greater than Vth_high, then method 500 proceeds to block 508 wherein one delay cell is removed from the ring voltage-controlled oscillator phase-locked loop 100. The removal of delay cell is followed by a wait of X microseconds in block 510. In some embodiments, block 510 will include waiting for Lock Detector 106 'lock' signal. At block 506, if Vtune is found to be less than Vth_high, method 500 proceeds to block 512. At block 512, method 500 checks whether Vtune is less than Vth_low. If Vtune is found to be lower than Vth_low, method 500 proceeds to block 514 wherein a delay cell is added to the ring voltage-controlled oscillator phase-locked loop 100. The addition of delay cell is followed by a wait for X microseconds in block 510. On the other hand, at block 512 if Vtune is found to be larger than Vth_low then method 500 has completed.

In the foregoing specification, specific embodiments have been described. However, one of ordinary skill in the art appreciates that various modifications and changes may be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (for example, comprising a processor) to perform a method as described and claimed herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A ring voltage-controlled oscillator based phase-locked loop comprising:
   a delay line having a delay length extending beyond a predetermined length required for operation of the ring voltage-controlled oscillator based phase-locked loop;
   a tap tuning logic circuit coupled to the delay line;
   an integrated digital multi-rate clock generator coupled to the delay line;
   wherein the delay line is configured to receive a tuning voltage from a loop filter of the ring voltage-controlled oscillator, the tuning voltage controls the delay line and generates a plurality of tapped output signals; and
   wherein the digital multi-rate clock generator receives the plurality of tapped output signals and creates a plurality of clock signals.

2. The ring voltage-controlled oscillator based phase-locked loop of claim 1 further comprising:
   a loop filter and a plurality of comparators, wherein an output signal from the loop filter is provided to the plurality of comparators and the delay line.

3. The ring voltage-controlled oscillator based phase-locked loop of claim 2, wherein the plurality of comparators compares an output signal voltage of the loop filter to a first threshold voltage and a second threshold voltage.

4. The ring voltage-controlled oscillator based phase-locked loop of claim 2, wherein the plurality of comparators are coupled to the tap tuning logic circuit and the loop filter.

5. The ring voltage-controlled oscillator based phase-locked loop of claim 1, further comprising a first divider and a second divider, wherein the first divider receives a reference clock signal from a temperature controlled crystal oscillator and the second divider receives a signal from the delay line.

6. The ring voltage-controlled oscillator based phase-locked loop of claim 5, further comprising a phase detector and a lock detector.

7. The ring voltage-controlled oscillator based phase-locked loop of claim 6, wherein the lock detector is coupled to the first divider and the second divider.

8. The ring voltage-controlled oscillator based phase-locked loop of claim 7, wherein the phase detector is coupled to the first divider, the second divider and a charge pump.

9. A method of generating a multi-rate clock signal, the method comprising:
   providing a delay line for a phase-locked loop and that has a length extending beyond a predetermined length required for operation of the phase-locked loop;
   receiving a tuning voltage at the delay line;
   generating a plurality of tapped output signals using the delay line;
   receiving at a digital multi-rate clock generator the plurality of tapped output signals from the delay line; and
   combining at the digital multi-rate clock generator the plurality of tapped output signals to create one or more clock signals.

10. The method of claim 9, further comprising:
    performing an initial tuning of the phase-locked loop, where performing the initial tuning includes comparing the tuning voltage to a first threshold voltage and a second threshold voltage.

11. The method of claim 10, further comprising:
    adaptively adding and removing at least one delay line cell to create the one or more clock signals.

* * * * *